(12) United States Patent
Kuranuki

(10) Patent No.: US 11,437,828 B2
(45) Date of Patent: Sep. 6, 2022

(54) EQUALIZATION CIRCUIT AND POWER STORAGE SYSTEM

(71) Applicant: Panasonic Intellectual Property Management Co., Ltd., Osaka (JP)

(72) Inventor: Masaaki Kuranuki, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 71 days.

(21) Appl. No.: 17/266,173

(22) PCT Filed: Aug. 1, 2019

(86) PCT No.: PCT/JP2019/030198
§ 371 (c)(1),
(2) Date: Feb. 5, 2021

(87) PCT Pub. No.: WO2020/049910
PCT Pub. Date: Mar. 12, 2020

(65) Prior Publication Data
US 2021/0305816 A1    Sep. 30, 2021

(30) Foreign Application Priority Data

Sep. 6, 2018  (JP) .............................. JP2018-167046

(51) Int. Cl.
| | |
|---|---|
| *H02J 7/00* | (2006.01) |
| *G01R 19/165* | (2006.01) |
| *H01M 10/44* | (2006.01) |
| *H01M 10/48* | (2006.01) |
| *H02J 7/02* | (2016.01) |

(52) U.S. Cl.
CPC ...... *H02J 7/0016* (2013.01); *G01R 19/16538* (2013.01); *H01M 10/441* (2013.01); *H01M 10/482* (2013.01); *H02J 7/0019* (2013.01); *H02J 7/02* (2013.01)

(58) Field of Classification Search
CPC .................................................... H02J 7/0016
See application file for complete search history.

(56) References Cited

U.S. PATENT DOCUMENTS

| | | | |
|---|---|---|---|
| 2018/0123341 A1* | 5/2018 | Lehn ....................... | H02J 1/102 |
| 2020/0014219 A1* | 1/2020 | Thomson .............. | H02J 7/0019 |

FOREIGN PATENT DOCUMENTS

JP           7-322516           12/1995

OTHER PUBLICATIONS

International Search Report of PCT application No. PCT/JP2019/030198 dated Oct. 21, 2019.

* cited by examiner

*Primary Examiner* — Robert Grant
(74) *Attorney, Agent, or Firm* — McDermott Will & Emery LLP

(57) ABSTRACT

An equalization circuit includes a cell selection circuit that is provided between n cells and an inductor, and that can electrically connect both ends of any cell of the n cells to both ends of the inductor. An energy holding-consuming circuit can form a closed loop including the inductor when the cell selection circuit does not select any cell. The energy holding-consuming circuit also can form a closed loop of a first pattern with a small resistance component of the closed loop and a closed loop of a second pattern with a large resistance component of the closed loop.

8 Claims, 9 Drawing Sheets

EQUALIZATION CIRCUIT AND POWER STORAGE SYSTEM

CROSS-REFERENCE TO RELATED APPLICATIONS

This application is a U.S. national stage application of the PCT International Application No. PCT/JP2019/030198 filed on Aug. 1, 2019, which claims the benefit of foreign priority of Japanese patent application No. 2018-167046 filed on Sep. 6, 2018, the contents all of which are incorporated herein by reference.

TECHNICAL FIELD

The present invention relates to an equalization circuit for equalizing capacities among a plurality of cells or modules connected in series, and a power storage system.

BACKGROUND ART

In recent years, secondary batteries such as lithium-ion batteries and nickel-metal hydride batteries have been used for various purposes. The secondary batteries are each used for an in-vehicle (including an electric bicycle) application for supply of electric power to a drive motor of an electric vehicle (EV), a hybrid electric vehicle (HEV), or a plug-in hybrid vehicle (PHV), for power storage for a peak shift or a backup, and for frequency regulation (FR) for stabilizing a frequency of a system, for example.

Generally, a secondary battery such as a lithium ion battery performs equalization processing for equalizing capacities of a plurality of cells connected in series from the viewpoint of maintaining power efficiency and ensuring safety. The equalization processing includes a passive method and an active method. The passive method is performed such that a discharge resistor is connected to each of a plurality of cells connected in series, and capacities of the plurality of cells are equalized by discharging cells other than a cell having minimum voltage to allow all the cells to have the minimum voltage. The active method is performed such that capacities of a plurality of cells connected in series are equalized by transferring energy among the plurality of cells. Although the active method has less power loss than the passive method and can reduce a heat value, the passive method with a simple circuit configuration at low cost is currently the mainstream.

In recent years, a battery pack has been increased in energy capacity and output, especially in in-vehicle applications. That is, a capacity of each of cells and a number of series of the cells have increased in the battery pack. This causes an imbalance of the amount of energy among the plurality of cells to increase. Thus, the equalization processing is also increased in time required to eliminate the imbalance among the plurality of cells.

In contrast, reduction in time required for the equalization processing is required especially in in-vehicle applications. To eliminate a large imbalance of energy in a short time, a large current is required to flow to equalize the energy. The passive method eliminates an imbalance of energy by consuming a capacity of a cell having a high voltage using a resistor, so that increase in amount of current flowing into the resistor increases a heat value. As the number of series of cells increases as described above, a heat dissipation area for heat generated in the resistor is less likely to be secured on a substrate.

This increases need for the active method in which energy is transferred to a cell having a small capacity instead of converting the energy into heat to consume the energy. Examples of an equalization circuit of the active method include a circuit that transfers energy among cells using an inductor (e.g., refer to PTL 1).

CITATION LIST

Patent Literature

PTL 1: Unexamined Japanese Patent Publication No. 7-322516

SUMMARY OF THE INVENTION

As described above, the active method can transfer energy among a plurality of cells while suppressing heat generation, and thus exerts a great effect on a large energy transfer. In contrast, when an imbalance among a plurality of cells is small and only a small energy transfer is required, the active method may not exert a sufficient effect.

For example, when only one cell has a high voltage and other cells are equal in voltage, even transferring energy from the cell having the high voltage to any one of the other cells causes a balance of the other cells to be lost. Although it is conceivable to divide the energy and move the divided energy to the other cells, even moving the divided energy smaller than a minimum controller allowing transfer of energy does not enable capacities of multiple cells to be equalized.

In such a case, the passive method enables the capacities of the multiple cells to be equalized by simply discharging one cell having a high voltage. However, when an equalization circuit of the active method and an existing equalization circuit of the passive method in which a resistor and a switch are provided for each cell are used in combination with each other, the circuit increases in area to cause a lot of waste in design.

The present invention is made in view of such a situation, and an object of the present invention is to provide a technique for easily fine-tuning capacities of a plurality of cells while suppressing increase in circuit area in an equalization circuit of an active method.

To solve the above problems, an equalization circuit of an exemplary embodiment of the present invention includes a voltage detector that detects voltage of each of n (n is an integer of two or more) cells connected in series, a controller that performs equalization processing among the n cells based on the voltage of each of the n cells detected by the voltage detector, an inductor, a cell selection circuit that is provided between the n cells and the inductor and is capable of electrically connecting opposite ends of any one of the n cells to corresponding opposite ends of the inductor, and an energy holding-consuming circuit for forming a closed loop including the inductor when the cell selection circuit does not select any one of the cells. The energy holding-consuming circuit can form a closed loop of a first pattern with a small resistance component of the closed loop and a closed loop of a second pattern with a large resistance component of the closed loop.

The present invention allows an equalization circuit of the active method to be capable of easy fine-tuning of a capacitance of each of a plurality of cells while suppressing increase in circuit area.

DESCRIPTION OF EMBODIMENT

Figure 1:
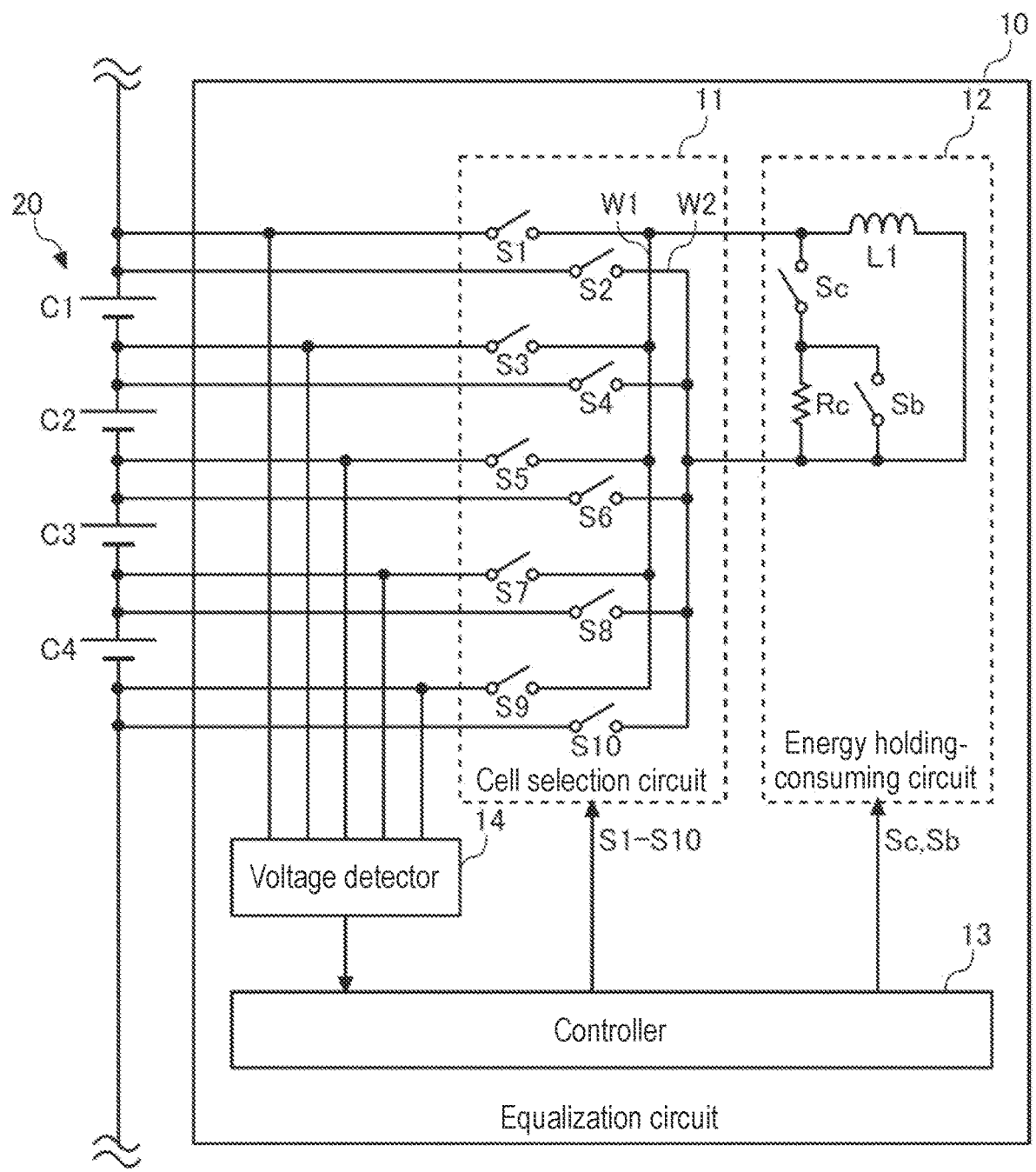
FIG. 1 is a diagram illustrating a configuration of a power storage system according to an exemplary embodiment of the present invention.

FIG. 1 is a diagram illustrating a configuration of power storage system 1 according to an exemplary embodiment of the present invention. Power storage system 1 includes equalization circuit 10 and power storage unit 20. Power storage unit 20 includes n (n is an integer of 2 or more) cells connected in series. FIG. 1 illustrates an example in which four cells C1 to C4 are connected in series. A number of cells connected in series varies according to voltage specifications required for power storage system 1.

For each cell, a rechargeable power storage element such as a lithium ion battery cell, a nickel hydrogen battery cell, a lead battery cell, an electric double layer capacitor cell, and a lithium ion capacitor cell is available. Hereinafter, in the present specification, an example using a lithium ion battery cell (having nominal voltage of 3.6 V to 3.7 V) is assumed.

Equalization circuit 10 includes voltage detector 14, cell selection circuit 11, energy holding-consuming circuit 12, and controller 13. Voltage detector 14 detects a voltage of each of n (four in FIG. 1) cells connected in series. Specifically, voltage detector 14 is connected to a node of each of the n cells connected in series using (n+1) voltage lines, and detects a voltage of each of the cells by detecting a voltage between two respective adjacent voltage lines. Voltage detector 14 can be composed of, for example, a general-purpose analog front-end integrated circuit (IC) or an application specific integrated circuit (ASIC). Voltage detector 14 converts the detected voltage of each of the cells into a digital value and outputs it to controller 13.

Cell selection circuit 11 is provided between the n cells connected in series and inductor L1 included in energy holding-consuming circuit 12, and can electrically connect both ends of the cell selected from the n cells to both ends of inductor L1. Cell selection circuit 11 includes first wire W1 connected to a first end of inductor L1, second wire W2 connected to a second end of inductor L1, (n+1) first wire side switches, and (n+1) second wire side switches. The (n+1) first wire side switches are each connected between a node of the corresponding one of the n cells connected in series and first wire W1. The (n+1) second wire side switches are each connected between a node of the corresponding one of the n cells connected in series and second wire W2.

FIG. 1 illustrates the example in which n is four and a number of nodes is five, and cell selection circuit 11 includes five first wire side switches and five second wire side switches. FIG. 1 illustrates first switch S1, third switch S3, fifth switch S5, seventh switch S7, and ninth switch S9 that are the first wire side switches, and second switch S2, fourth switch S4, sixth switch S6, eighth switch S8, and tenth switch S10 that are the second wire side switches.

Energy holding-consuming circuit 12 includes inductor L1, clamp switch Sc, resistor Rc, and bypass switch Sb. Clamp switch Sc is configured to electrically connect the both ends of inductor L1 to each other in energy holding-consuming circuit 12. Resistor Rc is a resistance element for consuming energy. Bypass switch Sb is connected in parallel with resistor Rc to form a path for bypassing resistor Rc.

Energy holding-consuming circuit 12 can form a closed loop including inductor L1 when cell selection circuit 11 does not select any one of the cells. The energy holding-consuming circuit also can form a closed loop of a first pattern with a small resistance component of the closed loop and a closed loop of a second pattern with a large resistance component of the closed loop.

When clamp switch Sc and bypass switch Sb are turned on, the closed loop of the first pattern including inductor L1, clamp switch Sc, and bypass switch Sb is formed. When clamp switch Sc is turned on and bypass switch Sb is turned off, the closed loop of the second pattern including inductor L1, clamp switch Sc, and resistor Rc is formed. The closed loop of the first pattern is configured to hold energy in energy holding-consuming circuit 12. The closed loop of the second pattern is configured to consume energy in energy holding-consuming circuit 12.

For first switch S1 to tenth switch S10, clamp switch Sc, and bypass switch Sb, semiconductor switches such as a metal-oxide-semiconductor field-effect transistor (MOSFET) and an insulated gate bipolar transistor (IGBT) are available. Hereinafter, an example in which the MOSFET is used for each of first switch S1 to tenth switch S10, clamp switch Sc, and bypass switch Sb is assumed.

Controller 13 performs equalization processing among the n cells connected in series based on the voltage of each of the n cells detected by voltage detector 14. Controller 13 can be composed of, for example, a microcomputer. Controller 13 and voltage detector 14 may be formed integrated into one chip.

In the present exemplary embodiment, controller 13 performs the equalization processing among the n cells connected in series by an active cell balance method. The active cell balance method according to the present exemplary embodiment is configured to equalize capacities of one cell (cell to be discharged) and another cell (cell to be charged) among the n cells connected in series by transferring energy from the one cell to the other cell. Repeating this energy transfer equalizes capacities of the n cells connected in series.

First, controller 13 controls cell selection circuit 11 to electrically connect both ends of a cell, which is to be discharged, of the n cells to the both ends of inductor L1 for a predetermined time. In this state, a current flows from the cell to be discharged to inductor L1 and energy is stored in inductor L1.

Next, controller 13 controls cell selection circuit 11 to electrically interrupt the n cells and inductor L1, and turn on clamp switch Ss and bypass switch Sb. In this state, a circulating current flows through the closed loop of the first pattern, and an inductor current is actively clamped in energy holding-consuming circuit 12.

Next, controller 13 turns off clamp switch Sc and bypass switch Sb, and controls cell selection circuit 11 to electrically connect both ends of a cell to be charged of then cells to the both ends of inductor L1 for a predetermined time. In this state, the inductor current actively clamped in energy holding-consuming circuit 12 flows to the cell to be charged. As a result, energy transfer from one cell to another cell is completed.

Figure 2:
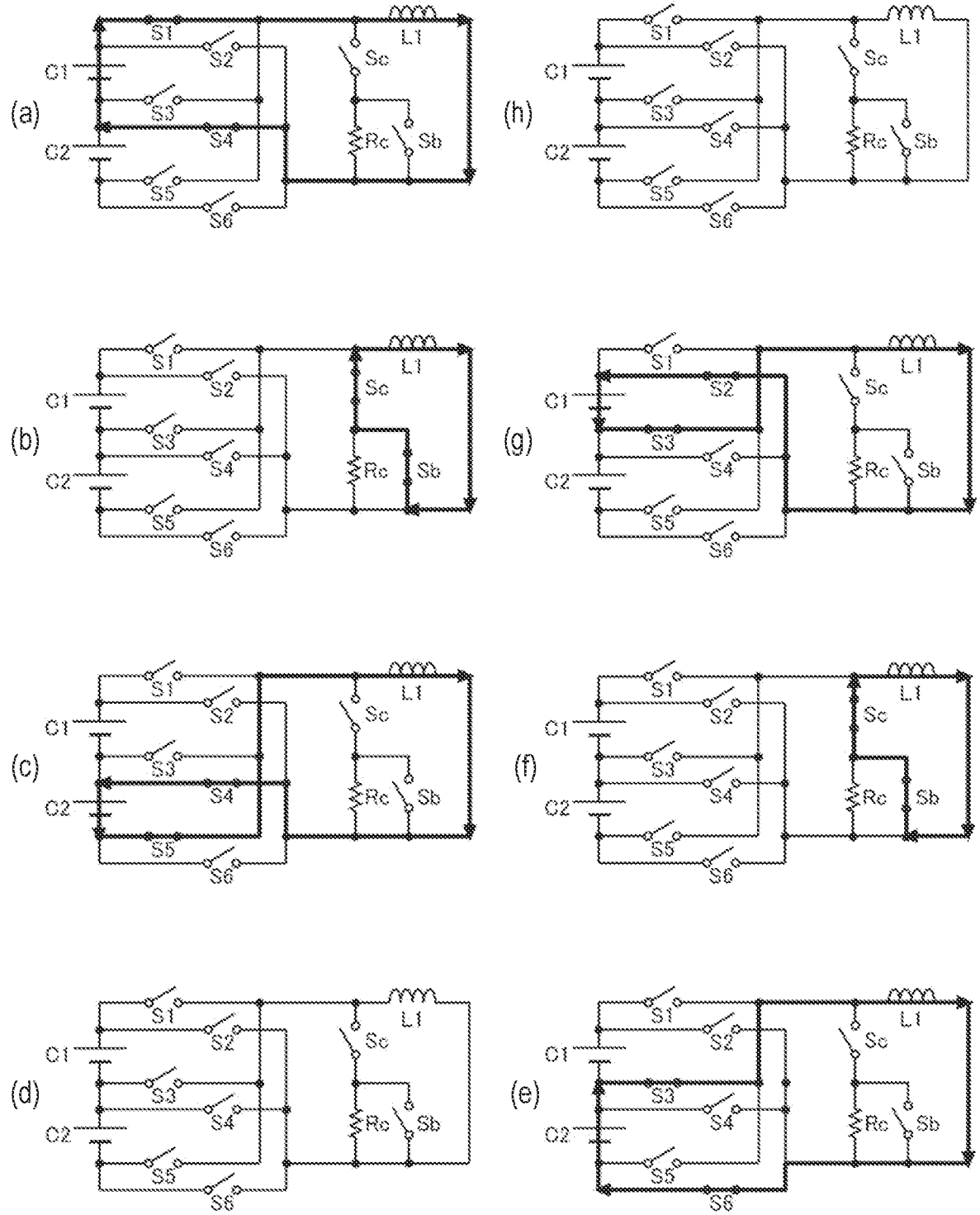
FIGS. 2(a) to 2(h) are each a diagram for illustrating an operation sequence example of equalization processing of a power storage system according to the exemplary embodiment of the present invention.

FIGS. 2(a) to 2(h) are each a diagram for illustrating an operation sequence example of the equalization processing of power storage system 1 according to the exemplary embodiment of the present invention. In this operation sequence example, the number of series of cells is set to two for simplifying description. FIG. 2(a) illustrates a first state in which controller 13 causes first switch S1 and fourth switch S4 to be turned on, and second switch S2, third switch S3, fifth switch S5, sixth switch S6, clamp switch Sc, and bypass switch Sb to be turned off. In this state, a current flows from first cell C1 to inductor L1, and energy discharged from first cell C1 is stored in inductor L1.

FIG. 2(b) illustrates a second state in which controller 13 causes clamp switch Sc and bypass switch Sb to be turned on, and first switch S1, second switch S2, third switch S3, fourth switch S4, fifth switch S5, and sixth switch S6 to be turned off. In this state, the energy stored in inductor L1 flows in the closed loop of the first pattern as the inductor current, and the inductor current is actively clamped.

FIG. 2(c) illustrates a third state in which controller 13 causes fourth switch S4 and fifth switch S5 to be turned on, and first switch S1, second switch S2, third switch S3, sixth switch S6, clamp switch Sc, and bypass switch Sb to be turned off. In this state, the inductor current actively clamped in the closed loop of the first pattern flows to second cell C2 to charge second cell C2.

FIG. 2(d) illustrates a fourth state in which controller 13 causes first switch S1, second switch S2, third switch S3, fourth switch S4, fifth switch S5, sixth switch S6, clamp switch Sc, and bypass switch Sb to be turned off. In this state, energy transfer from first cell C1 to second cell C2 is completed.

FIG. 2(e) illustrates a fifth state in which controller 13 causes third switch S3 and sixth switch S6 to be turned on, and first switch S1, second switch S2, fourth switch S4, fifth switch S5, clamp switch Sc, and bypass switch Sb to be turned off. In this state, a current flows from second cell C2 to inductor L1, and energy discharged from first cell C1 is stored in inductor L1.

FIG. 2(f) illustrates a sixth state in which controller 13 causes clamp switch Sc and bypass switch Sb to be turned on, and first switch S1, second switch S2, third switch S3, fourth switch S4, fifth switch S5, and sixth switch S6 to be turned off. In this state, the energy stored in inductor L1 flows in the closed loop of the first pattern as the inductor current, and the inductor current is actively clamped.

FIG. 2(g) illustrates a seventh state in which controller 13 causes second switch S2 and third switch S3 to be turned on, and first switch S1, fourth switch S4, fifth switch S5, sixth switch S6, clamp switch Sc, and bypass switch Sb to turned off. In this state, the inductor current actively clamped in the closed loop of the first pattern flows to first cell C1 to charge first cell C1.

FIG. 2(h) illustrates an eighth state in which controller 13 causes first switch S1, second switch S2, third switch S3, fourth switch S4, fifth switch S5, sixth switch S6, clamp switch Sc, and bypass switch Sb to be turned off. In this state, energy transfer from second cell C2 to first cell C1 is completed.

In the second or sixth state, the inductor current is actively clamped in the closed loop of the first pattern to secure continuity of the inductor current. This enables cell selection circuit 11 to switch a switch safely and reliably.

Figure 3:
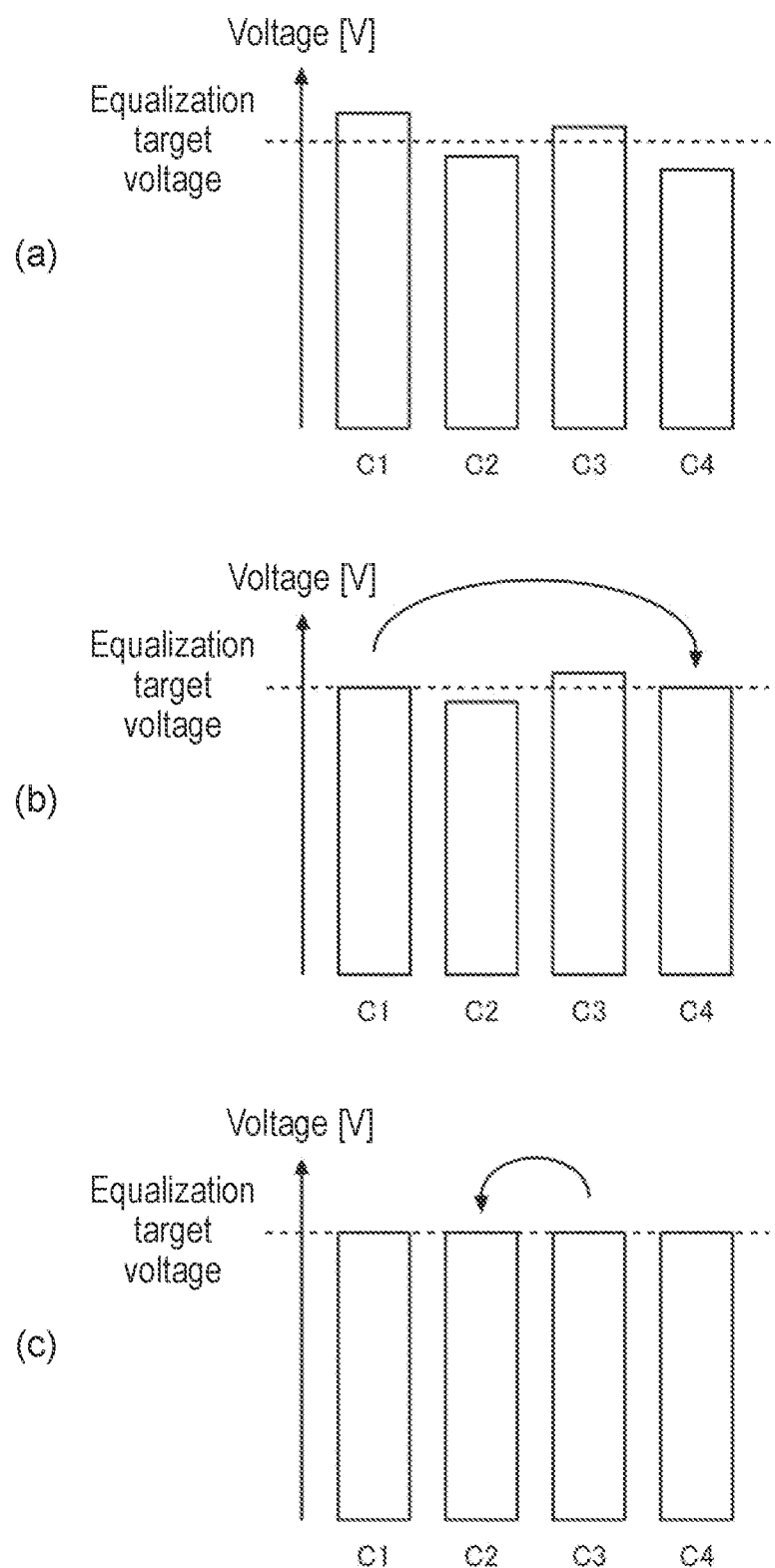
FIGS. 3(a) to 3(c) are each a diagram for illustrating specific example 1 of the equalization processing of the power storage system according to the exemplary embodiment of the present invention.

FIGS. 3(a) to 3(c) are each a diagram for illustrating specific example 1 of the equalization processing of power storage system 1 according to the exemplary embodiment of the present invention. In specific example 1, an example in which four cells C1 to C4 are connected in series is assumed. FIG. 3(a) is a diagram schematically illustrating a state of a voltage of each of first cell C1 to fourth cell C4 before the equalization processing is started. Controller 13 calculates an average value of voltages of first cell C1 to fourth cell C4 detected by voltage detector 14, and sets the calculated average value as an equalization target voltage (hereinafter, simply referred to as a target voltage).

Controller 13 transfers energy from a cell with a voltage higher than the target voltage to a cell with a voltage lower than the target voltage. For example, energy is transferred from the cell with the highest voltage among cells with voltages higher than the target voltage (first cell C1 in FIG. 3(a)) to the cell with the lowest voltage among cells with voltages lower than the target voltage (fourth cell C4 in FIG. 3(a)).

Controller 13 determines the amount of energy transfer within a range in which a source cell (cell to be discharged) has a voltage equal to or higher than the target voltage and a destination cell (cell to be charged) has a voltage equal to or lower than the target voltage. Then, controller 13 determines a discharge time of the source cell and a charge time of the destination cell based on the amount of energy transfer determined, and a discharge current and a charge current based on design. The amount of energy consumed while the inductor current is actively clamped in energy holding-consuming circuit 12 is negligible, so that the discharge time of the source cell is basically equal to the charging time of the destination cell.

FIG. 3(b) illustrates a state in which energy transfer from first cell C1 being the source cell to fourth cell C4 being the destination cell is completed. Controller 13 performs the above-described processing again. Specifically, energy is transferred from the cell with the highest voltage among cells with the voltage higher than the target voltage (third cell C3 in FIG. 3(b)) to the cell with the lowest voltage among cells with the voltage lower than the target voltage (second cell C2 in FIG. 3(b)).

FIG. 3(c) illustrates a state in which energy transfer from third cell C3 being the source cell to second cell C2 being the destination cell is completed. As described above, the equalization processing for four cells C1 to C4 connected in series is completed.

FIGS. 3(a) to 3(c) each show specific example 1 in which an average value of voltages of a plurality of cells connected in series is first calculated to set the target value. On this point, an algorithm without setting the target value is also available. At each time point, controller 13 transfers energy from a cell that is highest in voltage of the plurality of cells connected in series to a cell that is lowest in voltage thereof to equalize voltages of the two cells. Controller 13 repeatedly performs this processing until the voltages of the plurality of cells connected in series are all equalized.

Although specific example 1 above is described, for example, in which the voltage is used as an equalization target value, an actual capacity, a dischargeable capacity, or a rechargeable capacity may be used instead of the voltage.

Figure 4:
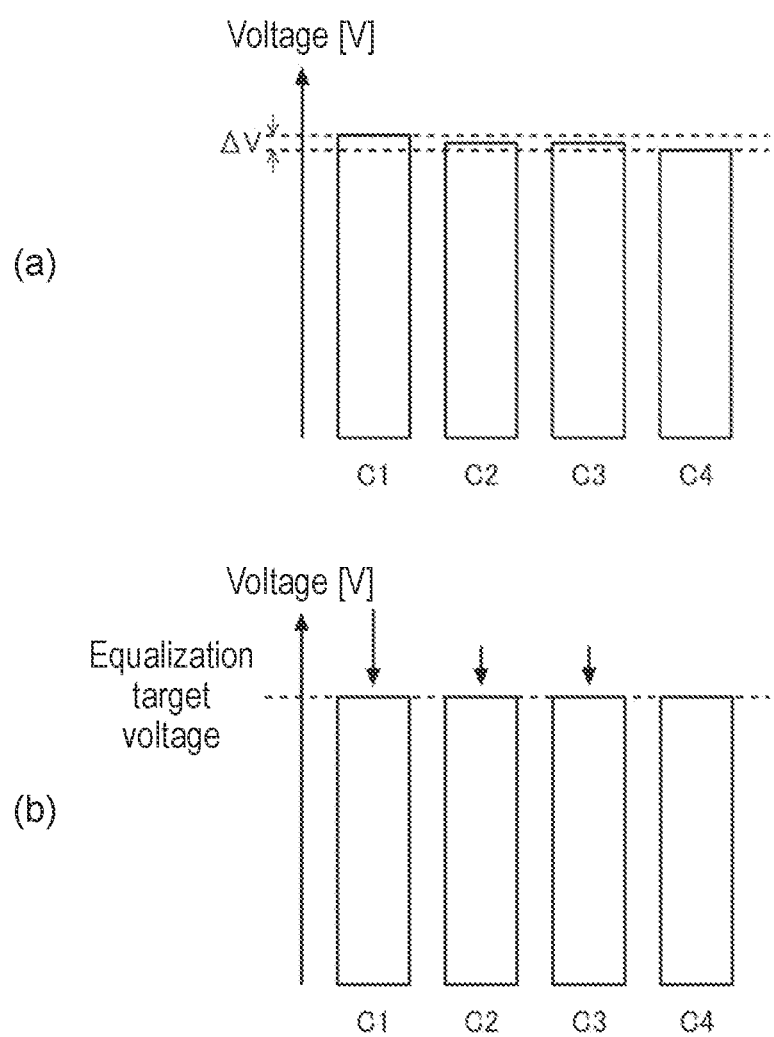
FIGS. 4(a) and 4(b) are each a diagram for illustrating specific example 2 of the equalization processing of the power storage system according to the exemplary embodiment of the present invention.

FIGS. 4(a) and 4(b) are each a diagram for illustrating specific example 2 of the equalization processing of power storage system 1 according to the exemplary embodiment of the present invention. FIG. 4(a) shows the following: difference ΔV between a voltage of a cell highest in voltage among first cell C1 to fourth cell C4 connected in series (first cell C1 in FIG. 4(a)) and a voltage of a cell lowest in voltage among those (fourth cell C4 in FIG. 4(a)); and the amount of energy to be transferred between the cells based on difference ΔV, the amount thereof being smaller than a set value.

The minimum amount of energy that can be transferred from one cell to another cell is limited by operating speed of a switch. In general, a MOSFET tends to have higher on-resistance as its operating speed increases. When a MOSFET with a small on-resistance is used to suppress loss and heat generation due to the on-resistance, its operating speed decreases. Decrease in operating speed of a switch increases the minimum amount of energy that can pass through the switch by turning on and off the switch. The set value above is mainly predetermined by a designer based on operating speed of a switch being used. That is, the set value above defines a minimum control unit when energy is transferred between cells.

When the amount of energy to be transferred from one cell to another cell is smaller than the set value above, controller 13 controls cell selection circuit 11 to electrically connect both ends of the one cell to be discharged to the both ends of inductor L1 for a predetermined time. In this state, a current flows from the cell to be discharged to inductor L1 and energy is stored in inductor L1.

Next, controller 13 controls cell selection circuit 11 to electrically interrupt the n cells and inductor L1, and turn on clamp switch Ss. Then, bypass switch Sb is not turned on. In this state, a circulating current flows through the closed loop of the second pattern, and an inductor current is consumed in energy holding-consuming circuit 12.

When the amount of energy to be transferred based on difference ΔV is smaller than the set value above in FIG. 4(a), controller 13 sets a voltage of fourth cell C4, which is lowest in voltage among first cell C1 to fourth cell C4 connected in series, as a target value. Controller 13 calculates a discharge time required to match a voltage of first cell C1 to the target value by consuming a capacity of first cell C1 in resistor Rc in energy holding-consuming circuit 12. Controller 13 controls cell selection circuit 11 to electrically connect both ends of first cell C1 to the both ends of inductor L1 for the discharge time calculated. Similarly, controller 13 discharges a capacity of second cell C2 and a capacity of third cell C3, and equalizes voltages of first cell C1 to fourth cell C4 connected in series to the target value. FIG. 4(b) shows a state in which the equalization processing of first cell C1 to fourth cell C4 connected in series is completed by energy consumption of first cell C1 to third cell C3.

Figure 5:
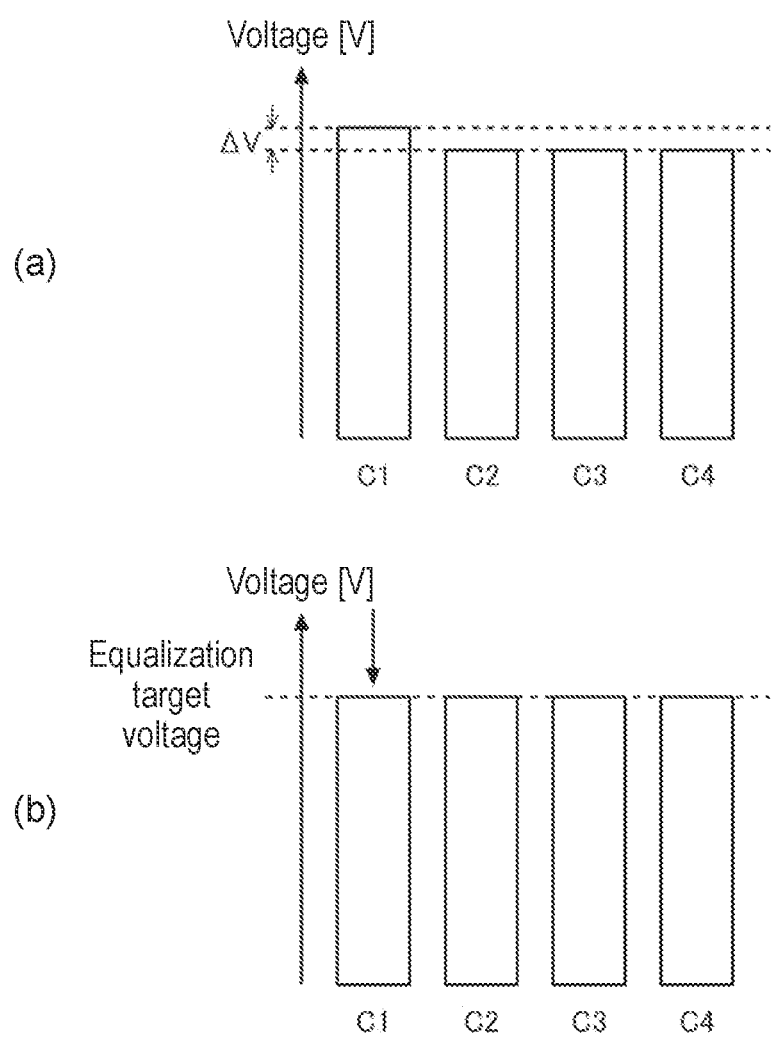
FIGS. 5(a) and 5(b) are each a diagram for illustrating specific example 3 of the equalization processing of the power storage system according to the exemplary embodiment of the present invention.

FIGS. 5(a) and 5(b) are each a diagram for illustrating specific example 3 of the equalization processing of power storage system 1 according to the exemplary embodiment of the present invention. FIG. 5(a) shows the following: difference ΔV between a voltage of a cell highest in voltage among a plurality of cells connected in series and a voltage of a cell lowest in voltage among them; the amount of energy to be transferred between the cells based on difference ΔV, the amount thereof being smaller than the set value above; and the plurality of cells other than the cell highest in voltage, being equal in voltage.

When only one cell among a plurality of cells connected in series has a high voltage, even transferring energy from the cell having the high voltage to any one of the other cells causes a voltage balance of the other cells to be lost. FIG. 5(a) shows the example in which even when energy is transferred from first cell C1 to any one of second cell C2 to fourth cell C4, a voltage balance among second cell C2 to fourth cell C4 is lost. In this case, it is more efficient to consume the energy of first cell C1 than to transfer the energy of first cell C1. FIG. 5(b) shows a state in which the equalization processing of first cell C1 to fourth cell C4 connected in series is completed by energy consumption of first cell C1.

When only one cell among a plurality of cells connected in series has a high voltage as shown in FIG. 5(a), the set value above may be increased by adding a predetermined value to the set value above. When only one cell has a high voltage, consuming energy of the one cell having the high voltage more greatly reduces a processing time than dividing the energy and sequentially transferring the divided energy to other cells. Thus, when only one cell has a high voltage, a design of increasing a case for consuming energy of the one cell is one of effective designs.

Figure 6:
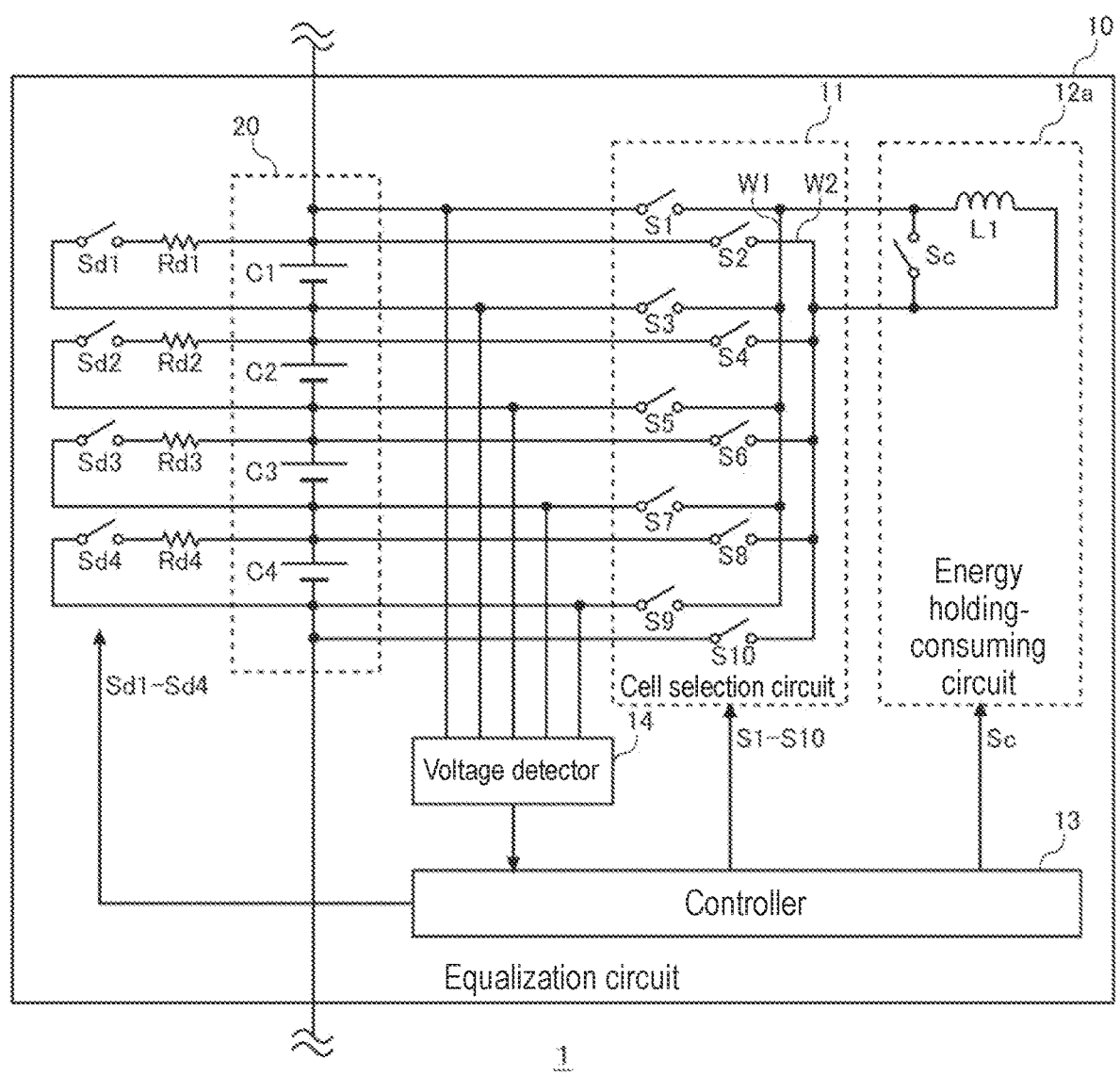
FIG. 6 is a diagram illustrating a configuration of a power storage system according to a comparative example.

FIG. 6 is a diagram illustrating a configuration of power storage system 1 according to a comparative example. The configuration of the power storage system 1 according to the comparative example is different from the configuration of the power storage system 1 according to the exemplary embodiment illustrated in FIG. 1 in that energy holding-consuming circuit 12 is replaced with energy holding circuit 12a. Energy holding circuit 12a has a configuration in which resistor Rc and bypass switch Sb are removed from energy holding-consuming circuit 12. Energy holding circuit 12a has no function of consuming energy stored in inductor L1 using resistor Rc.

In the configuration of power storage system 1 according to the comparative example, a circuit configuration of a general passive method is added. That is, a discharge circuit is provided in parallel with each cell. Specifically, first discharge switch Sd1 and first discharge resistor Rd1 are connected in series to opposite ends of first cell E1, second discharge switch Sd2 and second discharge resistor Rd2 are connected in series to opposite ends of second cell E2, third discharge switch Sd3 and third discharge resistor Rd3 are connected in series to opposite ends of third cell E3, and fourth discharge switch Sd4 and fourth discharge resistor Rd4 are connected in series to opposite ends of fourth cell E4.

The circuit configuration according to the comparative example illustrated in FIG. 6 using active cell balance and passive cell balance together requires an installation space of an active cell balance circuit while securing a heat dissipation space of a discharge resistor for the passive cell balance on a circuit board for each cell, and thus causes a lot of waste in design. In contrast, the circuit configuration according to the exemplary embodiment illustrated in FIG. 1 enables one resistor Rc in energy holding-consuming circuit 12 to serve as the discharge resistors for the passive cell balance. Thus, the heat dissipation space of the discharge resistor can be reduced to 1/n as compared with the configuration according to the comparative example. Additionally, a number of parts (resistors and switches) required for the passive cell balance can be reduced to 1/n.

As described above, the present exemplary embodiment allows an equalization circuit of the active method to be capable of easy fine-tuning of capacities of a plurality of cells while suppressing increase in circuit area. A general equalization circuit of the active method can transfer energy among a plurality of cells while suppressing heat generation. Thus, it is suitable for large energy transfer, but has a limit to small energy transfer. This may cause fine-tuning of capacities of the plurality of cells to be difficult. In contrast, a general equalization circuit of the passive method cannot transfer energy among a plurality of cells, but can easily fine-tune capacities of the plurality of cells.

The equalization circuit according to the present exemplary embodiment is provided with energy holding-consuming circuit 12 to enable achieving passive cell balance by consuming energy using resistor Rc while achieving active cell balance by actively clamping an inductor current. This enables both large energy transfer among a plurality of cells and fine-tuning of capacities of the plurality of cells, so that advantages of both the active method and the passive method can be acquired.

Additionally, no circuit part for consuming energy is required to be provided for each cell, so that the number of parts required for the passive method can be significantly reduced, and thus a heat dissipation area on a circuit board can also be significantly reduced. These reduction effects increase as the number of series of cells increases.

The present invention has been described above based on examples. The examples are exemplified, and it is easily understood by those skilled in the art that various modifications are available for combinations of each of components of the examples and each of processing process thereof, and that such modifications are also within the scope of the present invention.

Figure 7:
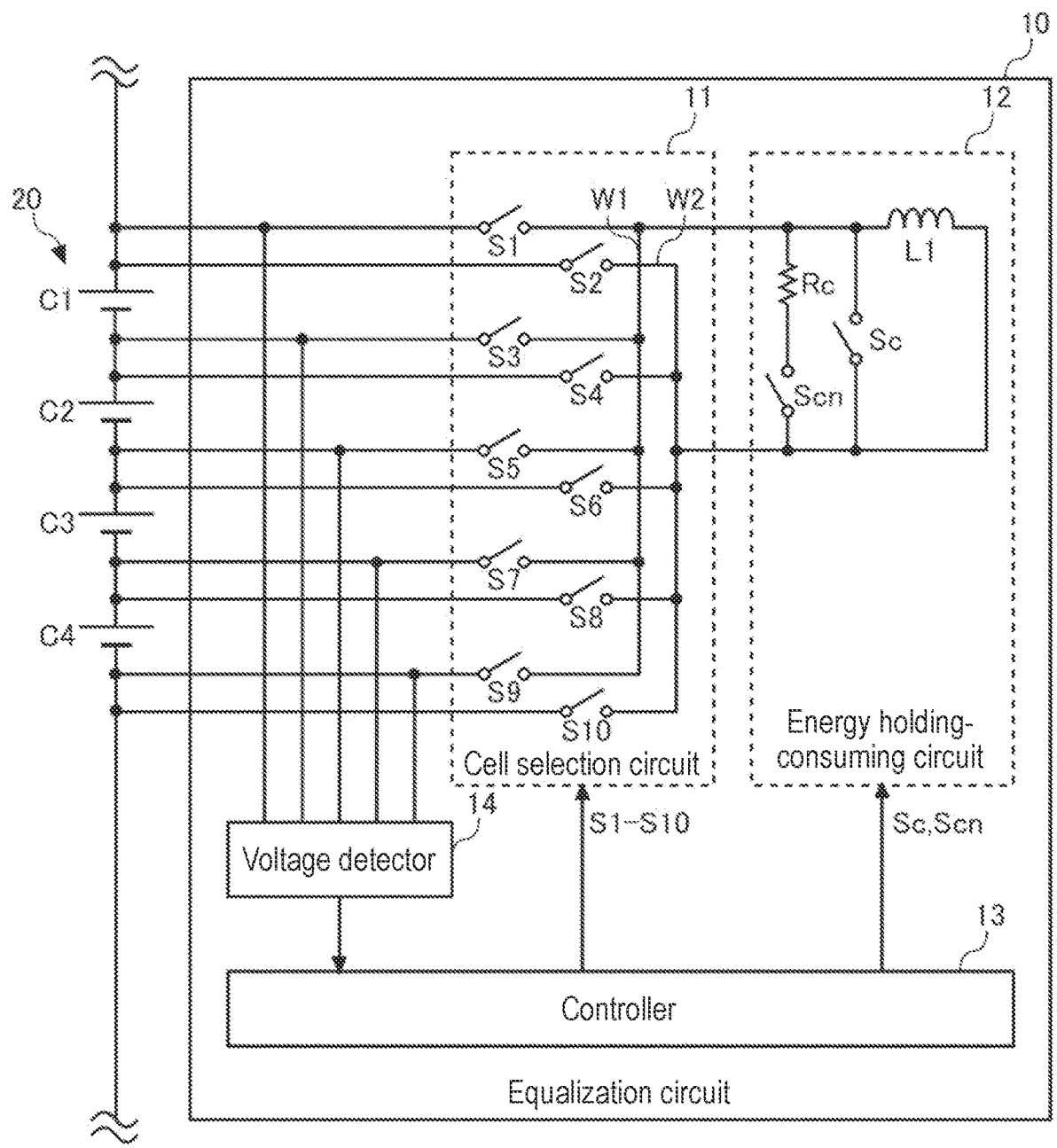
FIG. 7 is a diagram illustrating a configuration of a power storage system according to a first modification of the present invention.

FIG. 7 is a diagram illustrating a configuration of power storage system 1 according to a first modification of the present invention. The first modification includes continuity switch Scn that is used instead of bypass switch Sb in energy holding-consuming circuit 12. The first modification includes resistor Rc and continuity switch Scn connected in series that are connected in parallel with clamp switch Sc.

When clamp switch Sc is turned on and continuity switch Scn is turned off, the closed loop of the first pattern including inductor L1 and clamp switch Sc is formed. When clamp switch Sc is turned off and continuity switch Scn is turned on, the closed loop of the second pattern including inductor L1, resistor Rc, and continuity switch Scn is formed.

Comparing a basic example illustrated in FIG. 1 with the first modification illustrated in FIG. 7, a number of switches through which a current passes in the closed loop of the first pattern is two in the basic example and one in the first modification. A number of switches through which a current passes in the closed loop of the second pattern is one in each of the basic example and the first modification. Thus, the first modification can further reduce power loss when an inductor current is actively clamped.

Figure 8:
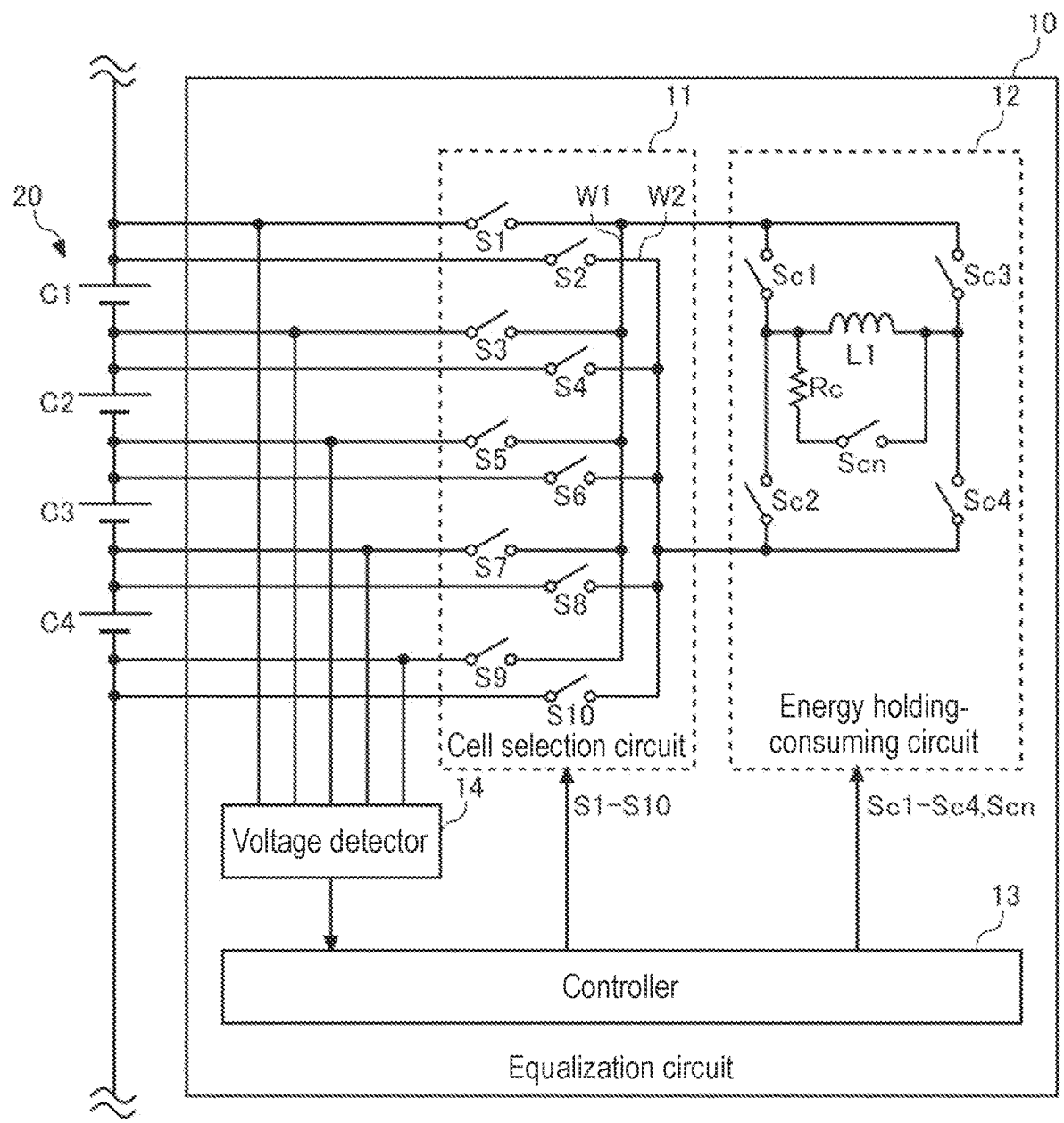
FIG. 8 is a diagram illustrating a configuration of a power storage system according to a second modification of the present invention.

FIG. 8 is a diagram illustrating a configuration of power storage system 1 according to a second modification of the present invention. The second modification includes a clamp switch in energy holding-consuming circuit 12, the clamp switch having a full bridge configuration. Energy holding-consuming circuit 12 according to the second modification includes first clamp switch Sc1 and second clamp switch Sc2 that are connected in series between first wire W1 and second wire W2. Between first wire W1 and second wire W2, third clamp switch Sc3 and fourth clamp switch Sc4 are further connected in series in parallel with first clamp switch Sc1 and second clamp switch Sc2. The first end of inductor L1 is connected to a midpoint between first clamp switch Sc1 and second clamp switch Sc2, and the second end of inductor L1 is connected to a midpoint between third clamp switch Sc3 and fourth clamp switch Sc4. Resistor Rc and continuity switch Scn connected in series are connected between the both ends of inductor L1.

When first clamp switch Sc1 and third clamp switch Sc3 are turned on, and second clamp switch Sc2, fourth clamp switch Sc4, and continuity switch Scn are turned off, a closed loop (forward direction) of a first pattern including first clamp switch Sc1, inductor L1, and third clamp switch Sc3 is formed. When second clamp switch Sc2 and fourth clamp switch Sc4 are turned on, and first clamp switch Sc1, third clamp switch Sc3, and continuity switch Scn are turned off, a closed loop (reverse direction) of a first pattern including second clamp switch Sc2, inductor L1, and fourth clamp switch Sc4 is formed. When first clamp switch Sc1 to fourth clamp switch Sc4 are turned off and continuity switch Scn is turned on, a closed loop of a second pattern including inductor L1, resistor Rc, and continuity switch Scn is formed.

In the configuration according to the second modification, a direction of a discharge current or a charge current can be appropriately selected. Even the configuration illustrated in FIG. 1 enables a direction of a discharge current or a charge current to be appropriately selected when first switch S1 to tenth switch S10 are each formed of a bidirectional switch.

Figure 9:
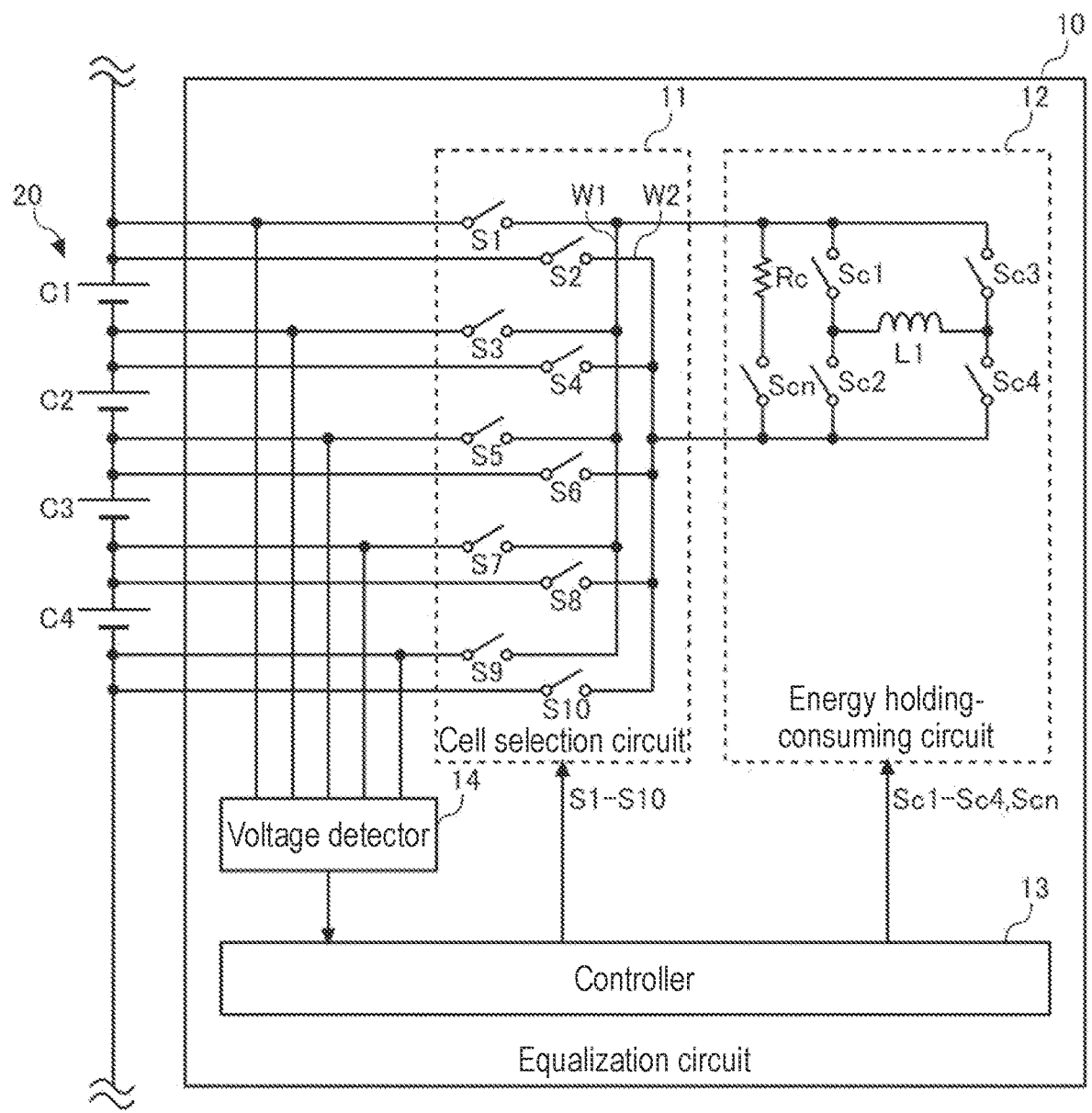
FIG. 9 is a diagram illustrating a configuration of a power storage system according to a third modification of the present invention.

FIG. 9 is a diagram illustrating a configuration of power storage system 1 according to a third modification of the present invention. The third modification also includes a clamp switch in energy holding-consuming circuit 12, the clamp switch having a full bridge configuration. Resistor Rc and continuity switch Scn connected in series are connected between first wire W1 and second wire W2. Others are similar to those of the second modification.

In the above-described exemplary embodiment, an example of equalizing a plurality of cells connected in series by an active method and a passive method has been described. On this point, the equalization circuit according to the exemplary embodiment also can be used to equalize a plurality of modules connected in series. The "cell" in the present specification may be appropriately read as a "module". Additionally, equalization processing among a plurality of modules connected in series and equalization processing among a plurality of cells connected in series in each module may be performed in a multiple manner.

Resistor Rc and bypass switch Sb (continuity switch Scn) in energy holding-consuming circuit 12 may be eliminated. In that case, equivalent series resistance of inductor L1 and/or on-resistance of a MOSFET substitutes for resistor Rc. In this case, as maintenance time of the closed loop formed by turning on clamp switch Sc decreases, action of retaining energy increases. As the maintenance time of the closed loop increases, action of consuming energy increases. This modification is also one of effective options in an application allowing increase in equalization processing time.

The exemplary embodiment may be specified by the following items.

[Item 1]
Equalization circuit (10) including:
voltage detector (14) that detects a voltage of each of n cells (C1 to C4), n being an integer of two or more, connected in series;
controller (13) that performs equalization processing among n cells (C1 to C4) based on the voltage of each of n cells (C1 to C4) detected by voltage detector (14);
inductor (L1);
cell selection circuit (11) that is provided between n cells (C1 to C4) and inductor (L1) and is capable of electrically connecting both ends of any one of n cells (C1 to C4) to both ends of inductor (L1); and
energy holding-consuming circuit (12) for forming a closed loop including inductor (L1) when cell selection circuit (11) does not select any one of the cells, energy holding-consuming circuit (12) being capable of forming a closed loop of a first pattern with a small resistance component of the closed loop and a closed loop of a second pattern with a large resistance component of the closed loop.
This allows equalization circuit (10) of the active method to be capable of easy fine-tuning of capacities of the plurality of cells (C1 to C4) while suppressing increase in circuit area.
[Item 2]
Equalization circuit (10) according to item 1, wherein when a value of a capacity to be transferred from one cell to another cell of n cells (C1-C4) is larger than a set value, controller (13) performs the steps of:
controlling cell selection circuit (11) to electrically connect both ends of the one cell to be discharged among n cells (C1-C4) to the both ends of inductor (L1) for a predetermined time;
controlling cell selection circuit (11) to electrically interrupt n cells (C1 to C4) from inductor (L1), and causing energy holding-consuming circuit (12) to form the closed loop of the first pattern; and
causing energy holding-consuming circuit (12) to release the closed loop of the first pattern, and controlling cell selection circuit (11) to electrically connect both ends of a cell to be charged among n cells (C1-C4) to the both ends of inductor (L1) for a predetermined time.
This enables achieving active cell balance using energy transfer among cells (C1 to C4).
[Item 3]
Equalization circuit (10) according to item 1 or 2, wherein when an amount of energy to be transferred from one cell to another cell among n cells (C1-C4) is smaller than a set value, controller (13) performs the steps of:
controlling cell selection circuit (11) to electrically connect both ends of the one cell to be discharged among n cells (C1-C4) to the both ends of inductor (L1) for a predetermined time; and
controlling cell selection circuit (11) to electrically interrupt n cells (C1 to C4) from inductor (L1), and causing energy holding-consuming circuit (12) to form the closed loop of the second pattern.
This enables the energy of the cell to be discharged to be consumed with a small number of elements.
[Item 4]
Equalization circuit (10) according to item 1 or 2, wherein controller (13) performs the steps of:
determining a target voltage or a target capacity of each of n cells (C1 to C4) based on voltages of n cells (C1 to C4) detected by voltage detector (14);
determining a cell (C1 to C4) having a voltage or a capacity higher than the target voltage or the target capacity of as a cell to be discharged; and
determining a cell (C1 to C4) having a voltage or a capacity smaller than the target voltage or the target capacitance as a cell to be charged.
This enables achieving active cell balance using energy transfer among cells (C1 to C4).
[Item 5]
Equalization circuit (10) according to any one of items 1 to 4, wherein cell selection circuit (11) includes
first wire (W1) connected to one end of inductor (L1),
second wire (W2) connected to another end of inductor (L1),
(n+1) first wire side switches (S1, S3, S5, S7, S9) connected between corresponding one of nodes of n cells (C1 to C4) connected in series and first wire (W1), and
(n+1) second wire side switches (S2, S4, S6, S8, S10) connected between corresponding one of the nodes of n cells (C1 to C4) connected in series and second wire (W2).
This enables equalization circuit (10) of the active method to be fabricated with a small number of switches.
[Item 6]
Power storage system (1) including:
n cells (C1 to C4) connected in series, n being an integer of two or more; and
equalization circuit (10) according to any one of items 1 to 5.
This enables forming power storage system (1) allowing equalization circuit (10) of the active method to be capable of easy fine-tuning of capacities of the plurality of cells (C1 to C4) while suppressing increase in circuit area.
[Item 7]
Equalization circuit (10) including:
voltage detector (14) that detects a voltage of each of n modules (C1 to C4), n being an integer of two or more, connected in series;
controller (13) that performs equalization processing among n modules (C1 to C4) based on the voltage of each of n modules (C1 to C4) detected by voltage detector (14);
inductor (L1);
module selection circuit (11) that is provided between n modules (C1 to C4) and inductor (L1), and is capable of electrically connecting both ends of any one of n modules (C1 to C4) to both ends of inductor (L1); and
energy holding-consuming circuit (12) for forming a closed loop including inductor (L1) when module selection circuit (11) does not select any module, energy holding-consuming circuit (12) being capable of forming a closed loop of a first pattern with a small resistance component of the closed loop and a closed loop of a second pattern with a large resistance component of the closed loop.
This allows equalization circuit (10) of the active method to be capable of easy fine-tuning of capacities of the plurality of modules (C1 to C4) while suppressing increase in circuit area.
[Item 8]
Power storage system (1) including:
n modules (C1 to C4) connected in series, n being an integer of two or more; and
equalization circuit (10) according to item 7.
This enables forming power storage system (1) allowing equalization circuit (10) of the active method to be capable of easy fine-tuning of capacities of the plurality of modules (C1 to C4) while suppressing increase in circuit area.

REFERENCE MARKS IN THE DRAWINGS 1 power storage system
10 equalization circuit 11 cell selection circuit
12 energy holding-consuming circuit
12a energy holding circuit
13 controller
14 voltage detector
20 power storage unit
C1-C4 cell
S1-S10 switch
W1 first wire
W2 second wire
L1 inductor
Sc-Sc4 clamp switch
Sb bypass switch
Scn continuity switch
Rc resistor

The invention claimed is:

1. An equalization circuit comprising:
a voltage detector that detects a voltage of each of n cells, n being an integer of two or more, connected in series;
a controller that performs equalization processing among the n cells based on the voltage of each of the n cells detected by the voltage detector;
an inductor;
a cell selection circuit that is provided between the n cells and the inductor and is configure to electrically connect both ends of any one of the n cells to both ends of the inductor; and
an energy holding-consuming circuit for forming a closed loop including the inductor when the cell selection circuit does not select any one of the n cells,
the energy holding-consuming circuit being configure to form a closed loop of a first pattern with a smaller resistance component of the closed loop and a closed loop of a second pattern with a larger resistance component of the closed loop.

2. The equalization circuit according to claim 1, wherein when a value of a capacity to be transferred from one cell to another cell among the n cells is larger than a set value, the controller performs the steps of:
controlling the cell selection circuit such that the cell selection circuit electrically connects both ends of the one cell to be discharged among the n cells to the both ends of the inductor for a predetermined time;
controlling the cell selection circuit such that the cell selection circuit electrically interrupts the n cells from the inductor, and causes the energy holding-consuming circuit to form the closed loop of the first pattern; and
causing the energy holding-consuming circuit to release the closed loop of the first pattern, and controlling the cell selection circuit such that the cell selection circuit electrically connects both ends of a cell to be charged among the n cells to the both ends of the inductor for a predetermined time.

3. The equalization circuit according to claim 1, wherein when an amount of energy to be transferred from one cell to another cell among the n cells is smaller than a set value, the controller performs the steps of:
controlling the cell selection circuit such that the cell selection circuit electrically connects he both ends of the one cell to be discharged among the n cells to the both ends of the inductor for a predetermined time; and
controlling the cell selection circuit such that the cell selection circuit electrically interrupts the n cells from the inductor, and causes the energy holding-consuming circuit to form the closed loop of the second pattern.

4. The equalization circuit according to claim 1, wherein the controller performs the steps of:
determining a target voltage or a target capacity of each of the n cells based on voltages of the n cells detected by the voltage detector;
determining a cell having a voltage or a capacity higher than the target voltage or the target capacity of the cells as the cell to be discharged; and
determining a cell having a voltage or a capacity smaller than the target voltage or the target capacity as the cell to be charged.

5. The equalization circuit according to claim 1, wherein the cell selection circuit includes
a first wire connected to one end of the inductor,
a second wire connected to another end of the inductor,
(n+1) first wire side switches connected between the first wire and nodes of the n cells connected in series, and
(n+1) second wire side switches connected between the second wire and the nodes of the n cells connected in series.

6. A power storage system comprising:
the equalization circuit according to claim 1; and
the n cells connected in series, n being an integer of two or more.

7. An equalization circuit comprising:
a voltage detector that detects a voltage of each of n modules, n being an integer of two or more, connected in series;
a controller that performs equalization processing among the n modules based on the voltage of each of the n modules detected by the voltage detector;
an inductor;
a module selection circuit that is provided between the n modules and the inductor and is configured to electrically connect both ends of any one of the n modules to both ends of the inductor; and
an energy holding-consuming circuit for forming a closed loop including the inductor when the module selection circuit does not select any one of the n modules, the energy holding-consuming circuit being configured to form a closed loop of a first pattern with a smaller resistance component of the closed loop and a closed loop of a second pattern with a larger resistance component of the closed loop.

8. A power storage system comprising:
the equalization circuit according to claim 7: and
the n modules connected in series, n being an integer of two or more.

* * * * *